US012810936B2

(12) United States Patent
Dong et al.

(10) Patent No.: US 12,810,936 B2
(45) Date of Patent: Nov. 24, 2026

(54) MEMORY DEVICE, MEMORY SYSTEM, AND METHOD OF OPERATING THE SAME

(71) Applicant: YANGTZE MEMORY TECHNOLOGIES CO., LTD., Wuhan (CN)

(72) Inventors: Zhipeng Dong, Wuhan (CN); Xufeng Zhou, Wuhan (CN); Jianjie Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 199 days.

(21) Appl. No.: 18/676,135

(22) Filed: May 28, 2024

(65) Prior Publication Data

US 2025/0322878 A1 Oct. 16, 2025

Related U.S. Application Data

(63) Continuation of application No. PCT/CN2024/087884, filed on Apr. 16, 2024.

(51) Int. Cl.

*G11C 16/10* (2006.01)
*G11C 16/04* (2006.01)
*G11C 16/08* (2006.01)
*G11C 16/26* (2006.01)

(52) U.S. Cl.

CPC .......... *G11C 16/08* (2013.01); *G11C 16/0483* (2013.01); *G11C 16/10* (2013.01); *G11C 16/26* (2013.01)

(58) Field of Classification Search

CPC ..................................................... G11C 16/10
See application file for complete search history.

(56) References Cited

U.S. PATENT DOCUMENTS

2011/0069557 A1 3/2011 Namiki et al.
2011/0242892 A1 10/2011 Namiki et al.
2012/0163096 A1 6/2012 Futatsuyama et al.
2013/0010547 A1* 1/2013 Aritome ................. G11C 16/10
365/189.07

FOREIGN PATENT DOCUMENTS

WO 2008083196 A2 7/2008

OTHER PUBLICATIONS

International Search Report issued in corresponding International Application No. PCT/CN2024/087884, mailed on Aug. 27, 2024, 3 pages.
Communication pursuant to Article 94(3) EPC issued in corresponding European Application No. 24730865.3, mailed on May 18, 2026, 6 pages.

* cited by examiner

*Primary Examiner* — Jason Lappas
(74) *Attorney, Agent, or Firm* — BAYES PLLC

(57) ABSTRACT

A method of operating a memory device includes applying a first read voltage to a first word line WLn corresponding to target memory cells, applying a first pass voltage to a second word line WLn−1 corresponding to memory cells adjacent to the target memory cells, and applying a second pass voltage to a third word line WLn+1 corresponding to memory cells adjacent to the target memory cells. The second pass voltage is higher than the first pass voltage.

20 Claims, 7 Drawing Sheets

100

500

MEMORY DEVICE, MEMORY SYSTEM, AND METHOD OF OPERATING THE SAME

CROSS-REFERENCE TO RELATED APPLICATIONS

This application is a continuation of International Application No. PCT/CN2024/087884, filed on Apr. 16, 2024, entitled "MEMORY DEVICE, MEMORY SYSTEM, AND METHOD OF OPERATING THE SAME," which is hereby incorporated by reference in its entirety.

BACKGROUND

The present disclosure relates to a memory device, a memory system, and a method of operating the same.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase. For NAND Flash memory, an erase operation can be performed at the block level, and a program operation or a read operation can be performed at the page level.

SUMMARY

In one aspect, a method of operating a memory device includes: applying a first read voltage to a first word line WLn corresponding to target memory cells, applying a first pass voltage to a second word line WLn−1 corresponding to memory cells adjacent to the target memory cells, and applying a second pass voltage to a third word line WLn+1 corresponding to memory cells adjacent to the target memory cells. And the second pass voltage is higher than the first pass voltage.

In some implementations, in a forward programming scheme or a reverse programming scheme, the second word line WLn−1, the first word line WLn, and the third word line WLn+1 are applied with program voltages in sequence.

In some implementations, in the forward programming scheme, the second word line WLn−1 is closer to a source select gate of a memory string of the memory device than the third word line WLn+1.

In some implementations, in the reverse programming scheme, the third word line WLn+1 is closer to a source select gate of a memory string of the memory device than the second word line WLn−1.

In some implementations, the second pass voltage is between 7V and 9V.

In some implementations, the first pass voltage is between 6V and 8V.

In some implementations, the method further includes applying a third pass voltage to a fourth word line WLn−2, and applying a fourth pass voltage to a fifth word line WLn+2. The third pass voltage is equal to or lower than the first pass voltage.

In some implementations, the fourth pass voltage is lower than the second pass voltage.

In some implementations, the fourth pass voltage is higher than the first pass voltage.

In another aspect, a memory device includes: a memory cell array including memory cells, and a peripheral circuit coupled to the memory cell array. The peripheral circuit is configured to: apply a first read voltage to a first word line WLn corresponding to target memory cells, apply a first pass voltage to a second word line WLn−1 corresponding to memory cells adjacent to the target memory cells, and apply a second pass voltage to a third word line WLn+1 corresponding to memory cells adjacent to the target memory cells. And the second pass voltage is higher than the first pass voltage.

In some implementations, in a forward programming scheme or a reverse programming scheme, the second word line WLn−1, the first word line WLn, and the third word line WLn+1 are applied with program voltages in sequence.

In some implementations, in the forward programming scheme, the second word line WLn−1 is closer to a source select gate of a memory string of the memory device than the third word line WLn+1.

In some implementations, in the reverse programming scheme, the third word line WLn+1 is closer to a source select gate of a memory string of the memory device than the second word line WLn−1.

In some implementations, the second pass voltage is between 7V and 9V.

In some implementations, the first pass voltage is between 6V and 8V.

In some implementations, the peripheral circuit is configured to: apply a third pass voltage to a fourth word line WLn−2, and apply a fourth pass voltage to a fifth word line WLn+2. The third pass voltage is equal to or lower than the first pass voltage.

In some implementations, the fourth pass voltage is lower than the second pass voltage.

In some implementations, the fourth pass voltage is higher than the first pass voltage.

In yet another aspect, a memory system includes: a memory device, and a memory controller coupled to the memory device. The memory device includes: a memory cell array including memory cells, and a peripheral circuit coupled to the memory cell array. The peripheral circuit is configured to: apply a first read voltage to a first word line WLn corresponding to target memory cells, apply a first pass voltage to a second word line WLn−1 corresponding to memory cells adjacent to the target memory cells, and apply a second pass voltage to a third word line WLn+1 corresponding to memory cells adjacent to the target memory cells. The second pass voltage is higher than the first pass voltage.

In some implementations, in a forward programming scheme or a reverse programming scheme, the second word line WLn−1, the first word line WLn, and the third word line WLn+1 are applied with program voltages in sequence.

In some implementations, in the forward programming scheme, the second word line WLn−1 is closer to a source select gate of a memory string of the memory device than the third word line WLn+1.

In some implementations, in the reverse programming scheme, the third word line WLn+1 is closer to a source select gate of a memory string of the memory device than the second word line WLn−1.

In some implementations, the second pass voltage is between 7V and 9V.

In some implementations, the first pass voltage is between 6V and 8V.

In some implementations, the peripheral circuit is configured to: apply a third pass voltage to a fourth word line WLn−2, and apply a fourth pass voltage to a fifth word line WLn+2. The third pass voltage is equal to or lower than the first pass voltage.

In some implementations, the fourth pass voltage is lower than the second pass voltage.

In some implementations, the fourth pass voltage is higher than the first pass voltage.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
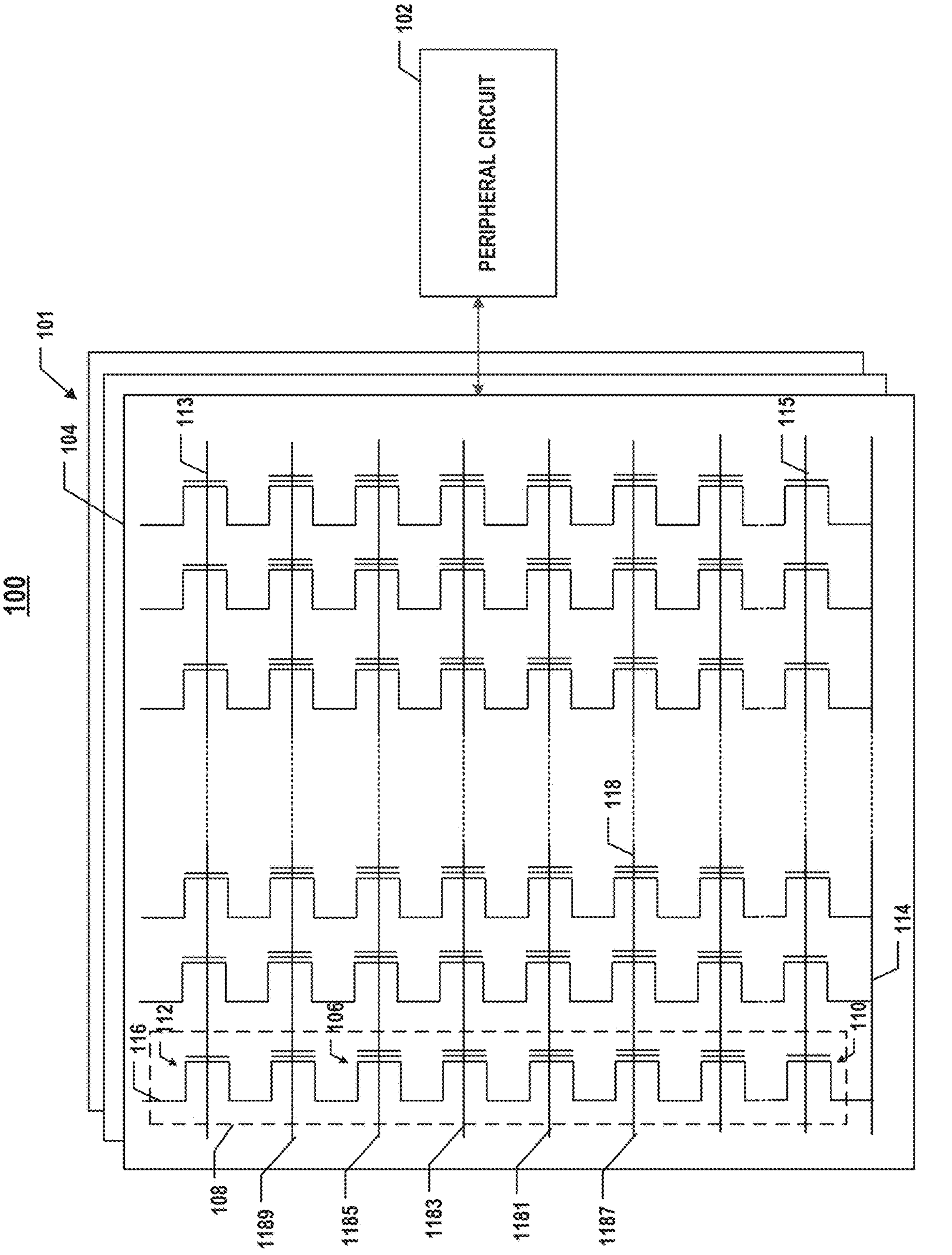
FIG. 1 illustrates a schematic circuit diagram of an example memory device including peripheral circuits, according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

In a non-volatile memory device, such as a three-dimensional (3D) NAND flash memory, an etching process may cause damage or generate defects within the structures of the memory device. These damages or defects lead to problems such as program disturbance or word line (WL) coupling issues. As the number of program or erase cycles increases, the electrons accumulated in these damages or defects increase the resistance of the neighboring WLs, thereby scaling the program disturbance or WL coupling issues, which eventually reduces the reliability of the memory device.

To address one or more of the aforementioned issues, the present disclosure introduces solutions in which several voltage schemes are used to decrease the coupling induced by the neighboring WLs. In particular, the present disclosure introduces solutions in which a separated neighboring WLs (e.g., first adjacent word line WLn−1 and second adjacent word line WLn+1 and) pass voltage (Vpass) scheme during the read operation can be used to decrease coupling induced edge summation (Esum) loss by damages or defects within, for example, a storage layer). Accordingly, Esum loss is reduced, the read margin is improved, and thus, the reliability of the memory device during the read operation is improved. It is noted that the Esum loss can be associated with a read margin of the memory device and thus can be used to estimate or determine the improvement of the read margin. In addition, by applying the solutions disclosed in the present application, the die-to-die Esum variation can also be improved. Furthermore, the voltage schemes disclosed herein require only firmware changes and increase little to no change of typical page programming time (tPROG).

FIG. 1 illustrates a schematic circuit diagram of a memory device 100 including peripheral circuits, according to some aspects of the present disclosure. Memory device 100 can include a memory cell array 101 and peripheral circuits 102 coupled to memory cell array 101. In some implementations, memory cell array 101 can be a NAND Flash memory cell array in which memory cells 106 are provided in the form of an array of three-dimensional (3D) NAND memory strings 108 each extending vertically above a substrate (not shown). In some implementations, each 3D NAND memory string 108 includes a plurality of memory cells 106 coupled in series and stacked vertically above the substrate. Each memory cell 106 can hold a continuous, analog value, such as an electrical voltage or charge, which depends on the number of electrons trapped within a region of memory cell 106. Each memory cell 106 can be either a floating gate type of memory cell including a floating-gate transistor or a charge trap type of memory cell including a charge-trap transistor. Each array of 3D NAND memory strings 108 can include one or more 3D memory devices.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in four or more memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1, each 3D NAND memory string 108 can include a source select transistor 110 at its source end and a drain select transistor 112 at its drain end. Source select transistor 110 and drain select transistor 112 can be configured to activate selected 3D NAND memory strings 108 (columns of the array) during read and program operations. In some implementations, the sources of source select transistors 110 of 3D NAND memory strings 108 in the same block 104 are coupled through a same source line (SL) 114, e.g., a common SL or an array common source (ACS), for example, to the ground. Drain select transistor 112 of each 3D NAND memory string 108 is coupled to a respective bit line 116 from which data can be read or programmed via an output bus (not shown), according to some implementations. In some implementations, each 3D NAND memory string 108 is configured to be selected or unselected by applying a select signal (e.g., a select voltage above the threshold voltage of drain select transistor 112) or a deselect signal (e.g., a deselect voltage such as 0 V) to respective drain select transistor 112 through one or more drain select lines 113 and/or by applying a select voltage (e.g., above the threshold voltage of source select transistor 110) or a deselect voltage (e.g., 0 V) to respective source select transistor 110 through one or more source select lines 115.

As shown in FIG. 1, 3D NAND memory strings 108 can be organized into multiple blocks 104, each of which can have a common source line 114. In some implementations, each block 104 is the basic data unit for erase operations, i.e., all memory cells 106 on the same block 104 are erased at the same time. Memory cells 106 can be coupled through word lines 118, which select which row of memory cells 106 is affected by read and program operations. In some implementations, each word line 118 is coupled to a row of memory cells 106, which is the basic data unit for program and read operations. Each word line 118 can be coupled to a plurality of control gates (gate electrodes) at each memory cell 106 in a respective row and a gate line coupling the control gates.

Word lines 118 include word lines WL1~WLm, where m is an integer equal or greater than 0. Word lines 118 may include a selected word line WLn 1183, a first adjacent word line WLn−1 (e.g., a first word line 1181 during a forward program scheme, or a second word line 1185 during a reverse program scheme), and a second adjacent word line WLn+1 (e.g., second word line 1185 during the forward program scheme, or first word line 1181 during the reverse program scheme), where n is an integer equal or greater than 0, n≤m. The selected word line WLn 1183 may correspond to a selected memory cell that is to be sensed and read in the current read operation by a read voltage. In some implementations, the selected word line WLn 1183 herein may also correspond to a selected memory cell that is programmed in the current program operation. That is, the read operation and the program operation are in a same loop of the program/read operation. First adjacent word line WLn−1 and second adjacent word line WLn+1 may correspond to unselected memory cells, respectively. It is noted that, during a forward program scheme or a reverse program scheme, memory cells corresponding to first adjacent word line WLn−1 (e.g., first word line 1181 during the forward program scheme, or second word line 1185 during the reverse program scheme) are programmed before memory cells corresponding to selected word line WLn 1183, and the memory cells corresponding to selected word line WLn 1183 is programmed before memory cells corresponding to second adjacent word line WLn+1 (e.g., second word line 1185 during the forward program scheme or first word line 1181 during the reverse program scheme). That is, the memory cells corresponding to first adjacent word line WLn−1 (e.g., first word line 1181 during the forward program scheme, or second word line 1185 during the reverse program scheme), the memory cells corresponding to selected word line WLn 1183, and the memory cells corresponding to second adjacent word line WLn+1 (e.g., second word line 1185 during the forward program scheme, or first word line 1181 during a reverse program scheme) are programmed in sequence. During the read operation, a read voltage is applied to the selected memory cell via selected word line WLn and a pass voltage is applied to unselected memory cells via unselected word lines (e.g., including unselected word lines WLn+1 and WLn−1).

In some implementations, first adjacent word line WLn−1 (e.g., first word line 1181) is closer to source line 114 than second adjacent word line WLn+1 (e.g., second word line 1185) during the forward program scheme. In some implementations, second adjacent word line WLn+1 (e.g., first word line 1181) is closer to source line 114 than first adjacent word line WLn−1 (e.g., second word line 1185) during the reverse program scheme.

In some implementations, word lines 118 may further include a word line WLn−2 (e.g., a third word line 1187 during the forward program scheme, or a fourth word line 1189 during the reverse program scheme) adjacent to first adjacent word line WLn−1, and a word line WLn+2 (e.g., fourth word line 1189 during the forward program scheme, or third word line 1187 during the reverse program scheme) adjacent to second adjacent word line WLn+1. During a forward program scheme or a reverse program scheme, the memory cells corresponding to third word line WLn−2, the memory cells corresponding to first adjacent word line WLn−1, the memory cells corresponding to selected word line WLn 1183, the memory cells corresponding to second adjacent word line WLn+1, and the memory cells corresponding to fourth word line WLn+2 are programmed in sequence.

Peripheral circuits 102 can be coupled to memory cell array 101 through bit lines 116, word lines 118, source lines 114, source select lines 115, and drain select lines 113. As described above, peripheral circuits 102 can include any suitable circuits for facilitating the operations of memory cell array 101 by applying and sensing voltage signals and/or current signals through bit lines 116 to and from each target memory cell 106 through word lines 118, source lines 114, source select lines 115, and drain select lines 113. Peripheral circuits 102 can include various types of peripheral circuits formed using complementary metal-oxide semiconductor (CMOS) technologies.

Figure 2:
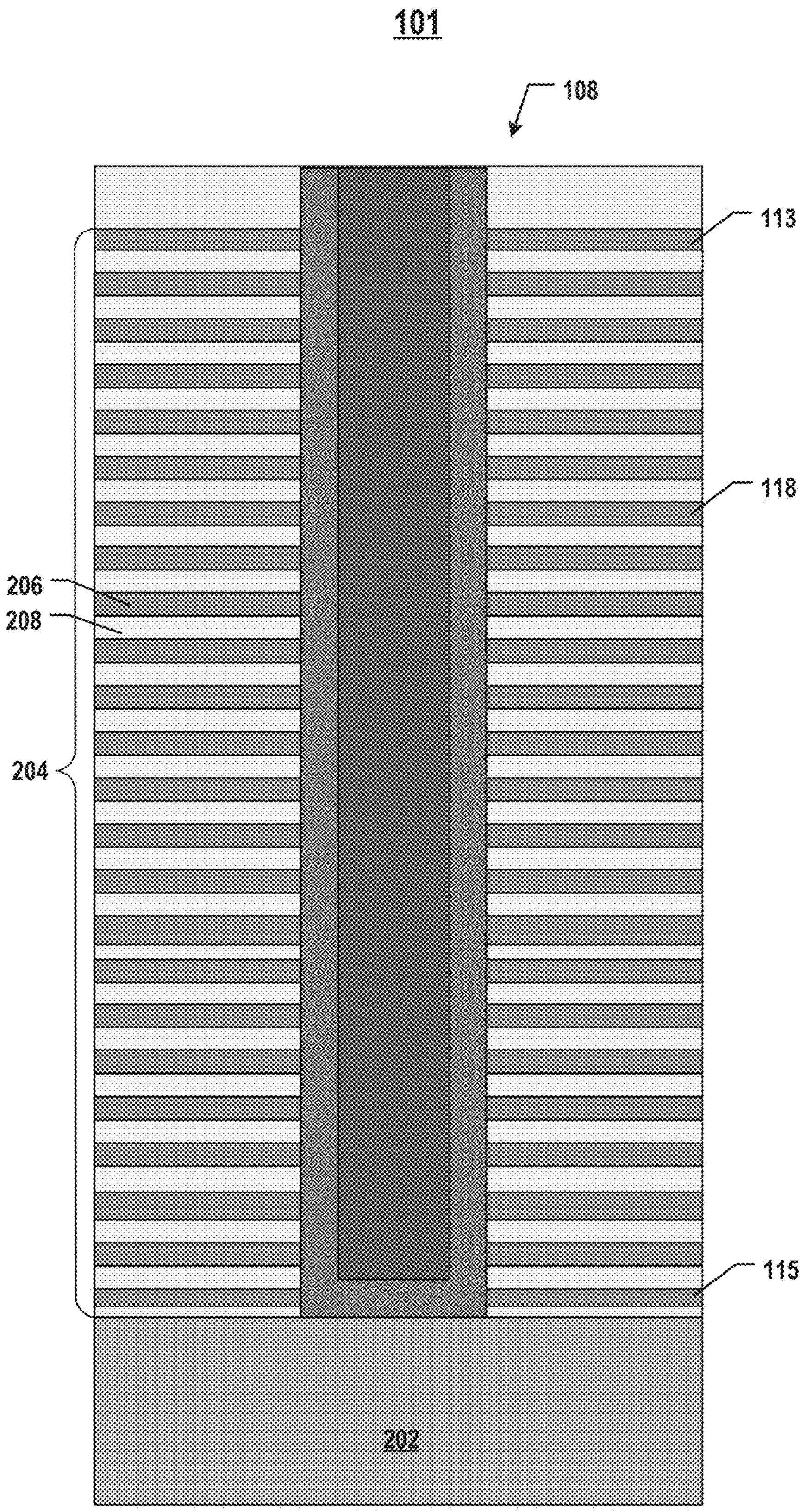
FIG. 2 illustrates a side view of a cross-section of a memory cell array including a NAND memory string, according to some aspects of the present disclosure.

FIG. 2 illustrates a side view of a cross-section of memory cell array 101 including NAND memory string 108, according to some implementations of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding memory cells 106, the gates of DSG transistors 112, or the gates of SSG transistors 110, and can extend laterally as DSG line 113 at the top of memory stack 204, SSG line 115 at the bottom of memory stack 204, or word line 118 between DSG line 113 and SSG line 115.

As shown in FIG. 2, NAND memory string 108 includes a channel structure extending vertically through memory stack 204. In some implementations, the channel structure includes a channel hole filled with semiconductor material (s) (e.g., as a semiconductor channel) and dielectric material (s) (e.g., as a memory film). In some implementations, the semiconductor channel includes silicon, such as amorphous silicon, polysilicon, or single crystalline silicon. In some implementations, the memory film is a composite layer including a tunneling layer, a storage layer (also known as a "charge trap layer"), and a blocking layer. The remaining space of the channel structure can be partially or fully filled with a capping layer including dielectric materials, such as silicon oxide, and/or an air gap. The channel structure can have a cylinder shape (e.g., a pillar shape). The capping layer, the semiconductor channel, the tunneling layer, the storage layer, and the blocking layer of the memory film are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the memory film can include a composite layer of silicon oxide/silicon oxynitride/silicon oxide (ONO). As discussed above, the etching process to form channel structures may generate damages or defects within the channel structures (e.g., tunneling layers, storage layers, blocking layers, or any interface between these layers). By utilizing the voltage scheme disclosed herein, the program disturbance or coupling issues may be reduced. It is understood that although not shown in FIG. 2, additional components of memory cell array 101 can be formed including, but not limited to, gate line slits/source contacts, local contacts, interconnect layers, etc.

Figure 3:
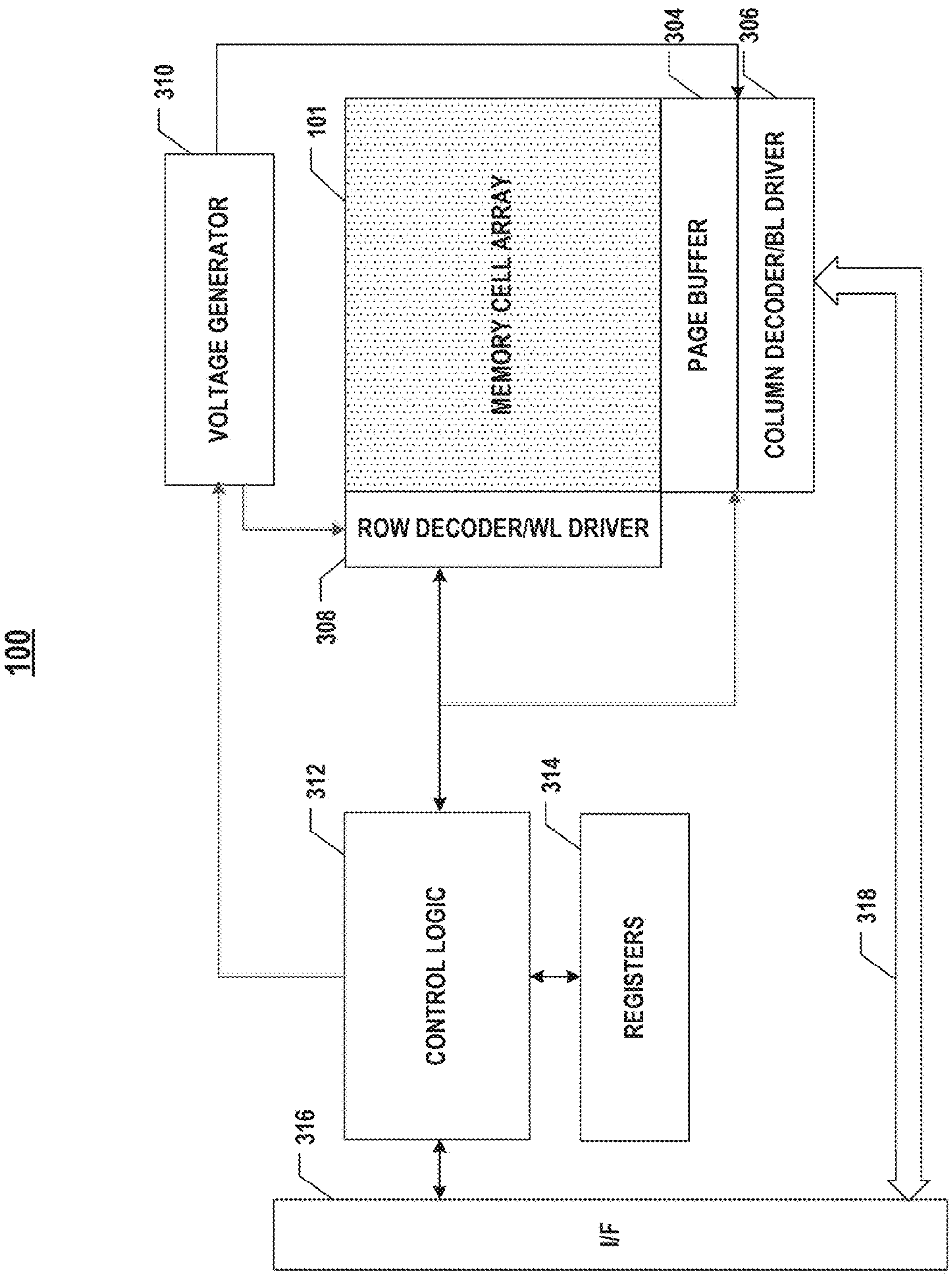
FIG. 3 illustrates a block diagram of an example memory device including a memory cell array and peripheral circuits, according to some implementations of the present disclosure.

FIG. 3 illustrates example peripheral circuits 102 including a page buffer 304, a column decoder/bit line driver 306, a row decoder/word line driver 308, a voltage generator 310, control logic 312, registers 314, an interface (I/F) 316, and a data bus 318. It is understood that in some examples, additional peripheral circuits 102 may be included as well.

Page buffer 304 can be configured to buffer data read from or programmed to memory cell array 101 according to the control signals of control logic 312. In one example, page buffer 304 may store one or more pages of program data (write data) to be programmed into one or more rows of memory cell array 101. In another example, page buffer 304 also performs program verify operations to ensure that the data has been properly programmed into memory cells 106 coupled to selected word lines 118.

Row decoder/word line driver 308 can be configured to be controlled by control logic 312 and select or unselect a block 104 of memory cell array 101 and select or unselect a word line 118 of selected block 104. Row decoder/word line driver 308 can be further configured to drive memory cell array 101. For example, row decoder/word line driver 308 may drive memory cells 106 coupled to the selected word line 118 using a word line voltage generated from voltage generator 310. In some implementations, row decoder/word line driver 308 can include a decoder and string drivers (driving transistors) coupled to local word lines and word lines 118.

Voltage generator 310 can be configured to be controlled by control logic 312 and generate the word line voltages (e.g., read voltage, program voltage, pass voltage, local voltage, verification voltage, etc.) to be supplied to memory cell array 101. In some implementations, voltage generator 310 provides voltages at various levels of different peripheral circuits 102 as described below in detail. Consistent with the scope of the present disclosure, in some implementations, the voltages provided by voltage generator 310, for example, to row decoder/word line driver 308 and page buffer 304 are above certain levels that are sufficient to perform the memory operations. For example, the voltages provided to page buffer 304 may be between 2 V and 3.3 V, such as 3.3 V, and the voltages provided to row decoder/word line driver 308 may be greater than 3.3 V, such as between 3.3 V and 30 V.

Column decoder/bit line driver 306 can be configured to be controlled by control logic 312 and select one or more 3D NAND memory strings 108 by applying bit line voltages generated from voltage generator 310. For example, column decoder/bit line driver 306 may apply column signals for selecting a set of N bits of data from page buffer 304 to be output in a read operation.

Control logic 312 can be coupled to each peripheral circuit 102 and configured to control operations of peripheral circuits 102. Registers 314 can be coupled to control logic 312 and include status registers, command registers, and address registers for storing status information, command operation codes (OP codes), and command addresses for controlling the operations of each peripheral circuit 102. Control logic 312 is configured to control the operations in the implementations of the present disclosure. For instance, control logic 312 is configured to control voltage generator 310 to apply word line voltages to implement the voltage schemes disclosed in the present disclosure.

Interface 316 can be coupled to control logic 312 and configured to interface memory cell array 101 with a memory controller (not shown). In some implementations, interface 316 acts as a control buffer to buffer and relay control commands received from the memory controller and/or a host (not shown) to control logic 312 and status information received from control logic 312 to the memory controller and/or the host. Interface 316 can also be coupled to page buffer 304 and column decoder/bit line driver 306 via data bus 318 and act as an Input/Output (I/O) interface and a data buffer to buffer and relay the program data received from the memory controller and/or the host to page buffer 304 and the read data from page buffer 304 to the memory controller and/or the host. In some implementations, interface 316 and data bus 318 are part of an I/O circuit of peripheral circuits 102.

Figure 4A:
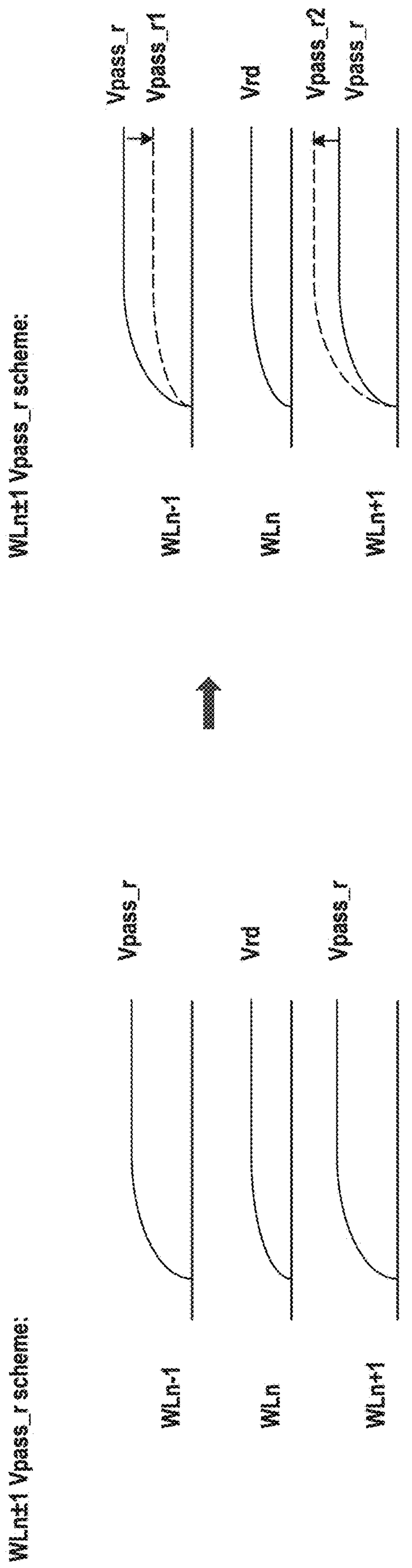
FIG. 4A illustrates an example voltage scheme applied to the memory device, according to some implementations of the present disclosure.

FIG. 4A illustrates an example voltage scheme applied to the memory device, according to some implementations of the present disclosure. According to FIG. 4A, one of the voltage schemes under a forward program is to apply a read voltage (Vrd) to a selected word line WLn corresponding to a selected memory cell, and, in the meanwhile or during a pre-determined period (e.g., the read voltage and the pass voltage can be applied at the same time or have an overlap turn-on time for a time period, and can be shut off at the same time or have a different turn-off time), to apply a pass voltage (Vpass_r) to a first adjacent word line WLn−1 and the pass voltage (Vpass_r) to a second adjacent word line WLn+1. To further reduce the program disturb and coupling issue as mentioned above, another voltage scheme under the forward program is to apply the read voltage (Vrd) to the selected word line WLn corresponding to a selected memory cell, and in the meanwhile or during the pre-determined period, to apply a first pass voltage (Vpass_r1) to first adjacent word line WLn−1 and a second pass voltage (Vpass_r2) to second adjacent word line WLn+1, where the first pass voltage Vpass_r1 is lower than the pass voltage Vpass_r, and the second pass voltage Vpass_r2 is higher than the pass voltage Vpass_r. That is, the second pass voltage Vpass_r2 applied to second adjacent word line WLn+1 is higher than the first pass voltage Vpass_r1 applied to first adjacent word line WLn−1. When the damages or defects are within the structures between storage layers and word lines, and the electrons trapped near second adjacent word line WLn+1 (or first adjacent word line WLn−1) increase the resistances. As such, a higher second pass voltage Vpass_r2 (and/or a lower first pass voltage Vpass_r1) can reduce the resistance induced by the electrons trapped, thereby reducing the Esum loss and improving the reliability of the memory device.

In some implementations, the second pass voltage Vpass_r2 is between 7V and 9V. For example, the second pass voltage Vpass_r2 may include 7.0, 7.1, 7.2, 7.3, 7.4, 7.5, 7.6, 7.7, 7.8, 7.9, 8.0, 8.1, 8.2, 8.3, 8.4, 8.5, 8.6, 8.7, 8.8, 8.9, or 9.0 V. In some implementations, the first pass voltage Vpass_r1 is between 6V and 8V. For example, the first pass voltage Vpass_r1 may include 6.0, 6.1, 6.2, 6.3, 6.4, 6.5, 6.6, 6.7, 6.8, 6.9, 7.0, 7.1, 7.2, 7.3, 7.4, 7.5, 7.6, 7.7, 7.8, 7.9, or 8.0 V. In some implementations, the read voltage is less than the first pass voltage (Vpass_r1) or the second pass voltage (Vpass_r2).

Since the damages or defects are within the structures between storage layers and word lines, and the electrons are trapped near second adjacent word line WLn+1 (or first adjacent word line WLn−1), the other word lines (e.g., WLn−2 or WLn+2) may be set to be different from the adjacent word lines so that the energy barrier or the defects that may cause the electrons being trapped in may be released. In some implementations, the voltage scheme further applies a third pass voltage (Vpass_r3) to word line WLn−2 (e.g., third word line 1187 during the forward program scheme, or a fourth word line 1189 during the reverse program scheme) and a fourth pass voltage (Vpass_r4) to word line WLn+2 (e.g., fourth word line 1189 during the forward program scheme, or third word line 1187 during the reverse program scheme). In some implementations, the third pass voltage Vpass_r3 applied to word line WLn−2 is equal to or lower than the first pass voltage Vpass_r1 applied to first adjacent word line WLn−1. In some implementations, the fourth pass voltage Vpass_r4 applied to word line WLn+2 is lower than the second pass voltage Vpass_r2 applied to second adjacent word line WLn+1. In some implementations, the fourth pass voltage Vpass_r4 applied to word line WLn+2 is higher than the first pass voltage Vpass_r1 applied to first adjacent word line WLn−1. By applying the voltage scheme herein, coupling induced edge summation (Esum) loss by damages or defects within the memory cell, for example, in a storage layer of the memory cell are reduced. In particular, by lower third pass voltage Vpass_r3 applied to word line WLn−2, the resistance of the word line WLn−2 increases. Thus, the influence of high resistance of the word line WLn+1 decreases, thereby reducing the coupling issues. Accordingly, when Esum loss is reduced, the read margin is also improved, thereby improving the reliability of the memory device during the read operation.

Figure 4B:
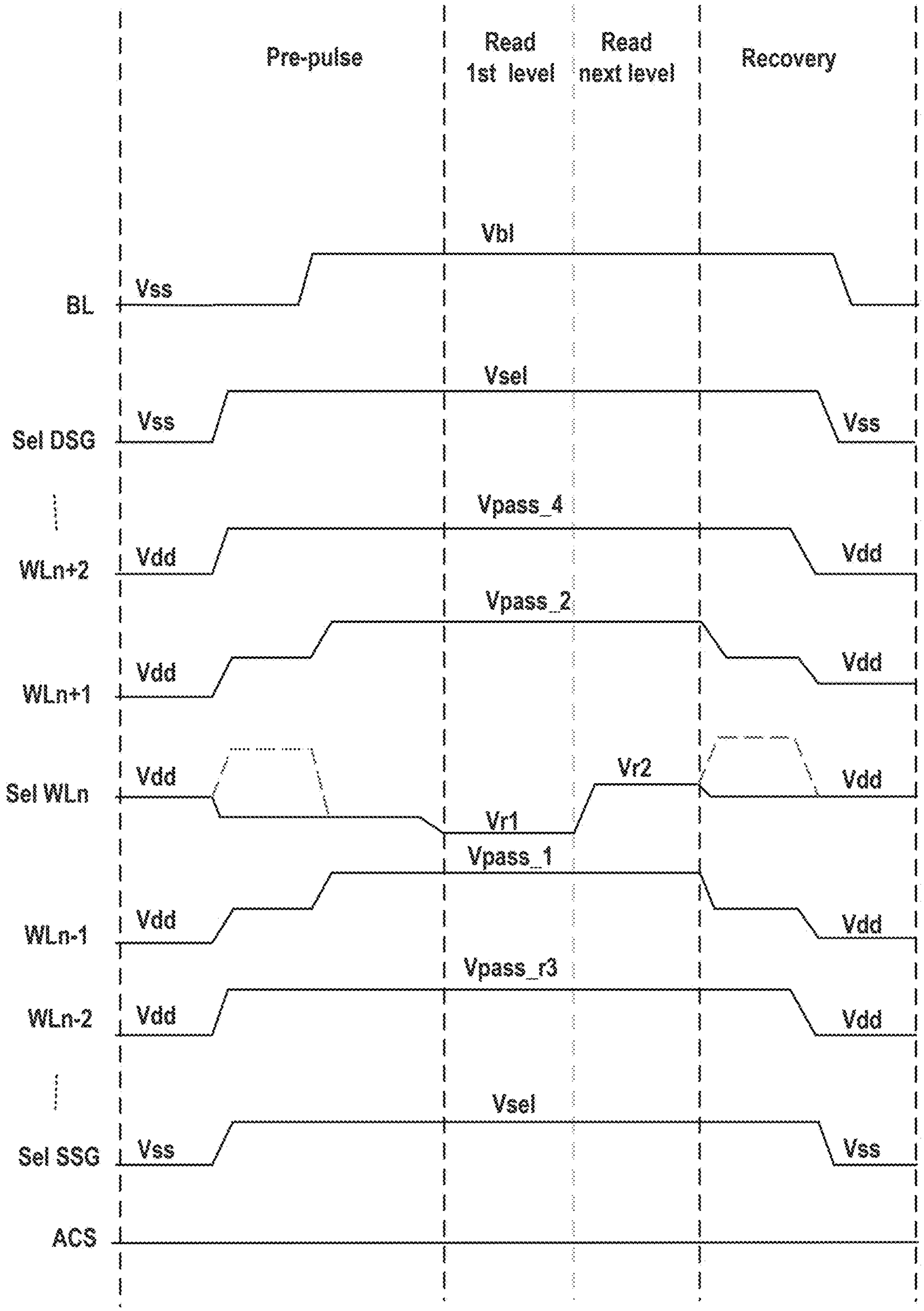
FIG. 4B illustrates an example voltage scheme applied to the memory device, according to some implementations of the present disclosure.

In some implementations, as shown in FIG. 4B, during the beginning of the read stage, selected top select gate line (e.g., selected DSG line 113), unselected word lines (e.g., WLn−2, WLn−1, WLn+1, WLn+2, etc.), selected word lines (e.g., WLn), and selected bottom select gate (e.g., selected SSG line 115) are all applied with pre-charge voltages to start a read pre-charge stage, while bit lines 116 stay in 0V or a low voltage state (e.g., lower then read pass voltage). The selected DSG line 113 and selected SSG line 115 are thus charged from a low voltage state (e.g., Vss) to a select voltage (e.g., Vsel) to turn on the DSG transistors and SSG transistors. The unselected word lines are charged from a low voltage state (e.g., Vdd) to pre-determined pass voltages (e.g., Vpass_1, Vpass_2, Vpass_3, Vpass_4, . . . etc.) to turn on the memory cells coupled to the unselected word lines (i.e., the unselected memory cells). The pre-determined pass voltages applied to unselected word lines are based on voltage schemes according to some implementations of the present disclosure. That is, at the end of the read pre-charge stage, in the select NAND memory strings, DSG transistors, SSG transistors, and unselect memory cells are all turned on by peripheral circuit 102. Next, bit line voltage increases from a low voltage state (e.g., Vss) to a bit line bias voltage (e.g., Vbl), for example, between 0.1 and 1V, meanwhile, the selected top select gate line (e.g., selected DSG line 113) and the selected bottom select gate line (e.g., selected SSG line 115) remain in a high voltage state (e.g., Vsel). Next, a read stage starts when the word line voltage applied to the selected word lines decreases to a first read voltage (Vr1) corresponding to a first read level to read memory cells in a first read level during a first read stage, and then increases to a second read voltage (Vr2) corresponding to a second read level to read the memory cells during a second read stage. Next, the selected top select gate line (e.g., selected DSG line 113) and the selected bottom select gate line (e.g., selected SSG line 115) decrease to a low voltage state (e.g., Vss) so as to close the read stage. Next, a recovery stage starts when a recovery pulse is applied to the selected word line (e.g., WLn), while the unselected word lines (e.g., WLn−2, WLn−1, WLn+1, WLn+2, etc.) remain in the high voltage state. Last, the selected word line and the unselected word lines decrease to the low voltage state so that the recovery stage is terminated. It is noted that during the read pre-charge stage and recovery stage, the voltage on the selected word line (e.g., WLn) may be coupled to be the same as the voltage on the unselect word lines (e.g., WLn−1 and WLn+1) that are adjacent to the selected word line, as shown in the dotted line in FIG. 4B.

Figure 5:
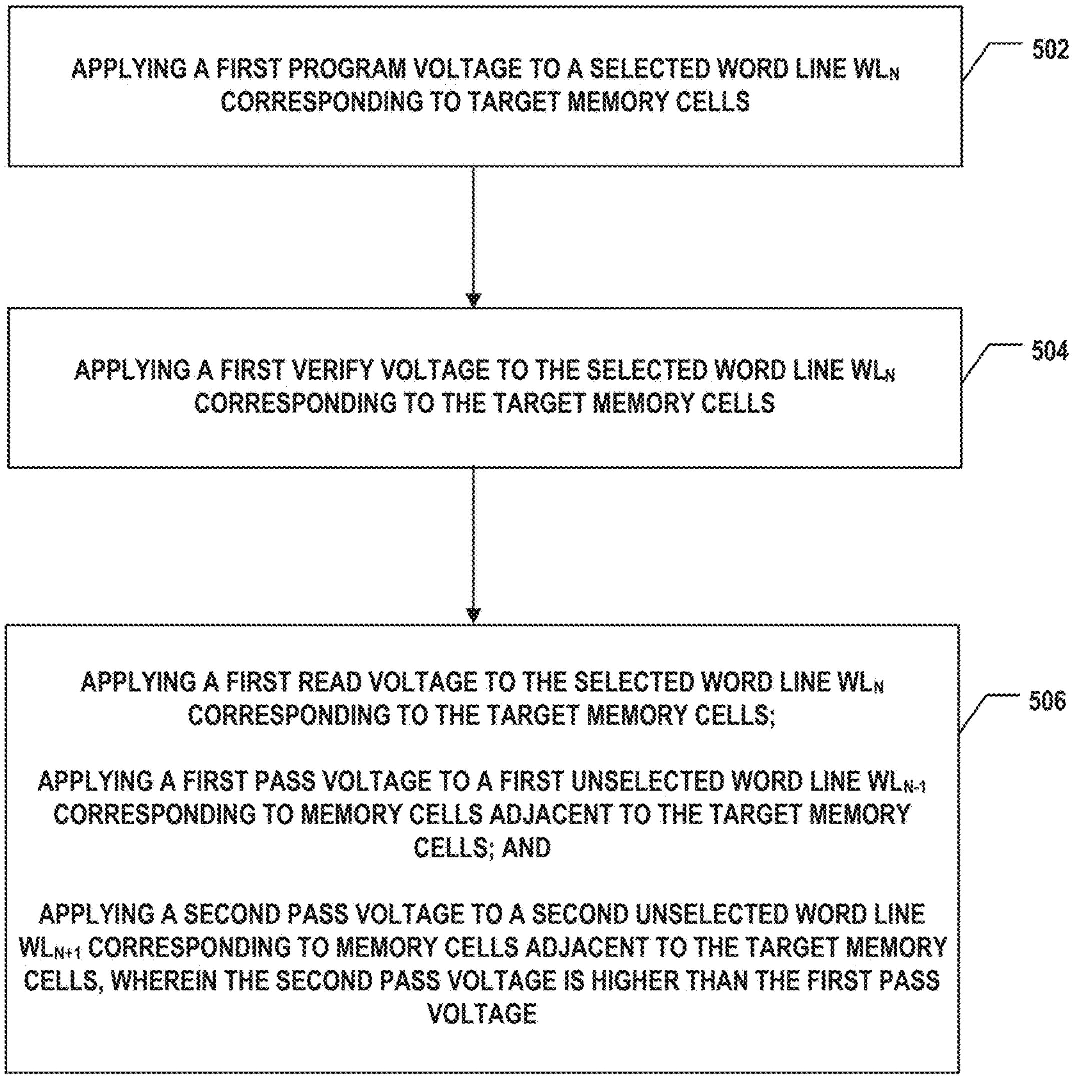
FIG. 5 illustrates a flowchart of an example method of operating the memory device, according to some implementations of the present disclosure.

FIG. 5 illustrates a flowchart of an example method of operating the memory device, according to some implementations of the present disclosure.

Method 500 starts at operation 502, in which a first program voltage is applied to a selected word line WLn (e.g., selected word line WLn 1183) corresponding to a target memory cell (e.g., the selected memory cell). In some implementations, the first program voltage is between 10 V to 30 V. For example, the first program voltage may include 10, 11, 12, 13, 14, 15, 16, 17, 18, 19, 20, 21, 22, 23, 24, 25, 26, 27, 28, 29, or 30 V.

It is noted that, during a forward program scheme or a reverse program scheme, memory cells corresponding to first adjacent word line WLn−1 (e.g., first word line 1181 during the forward program scheme, or second word line 1185 during the reverse program scheme) are programmed before memory cells corresponding to selected word line WLn 1183, and the memory cells corresponding to selected word line WLn 1183 is programmed before memory cells corresponding to second adjacent word line WLn+1 (e.g., second word line 1185 during the forward program scheme or first word line 1181 during the reverse program scheme). That is, the memory cells corresponding to first adjacent word line WLn−1 (e.g., first word line 1181 during the forward program scheme, or second word line 1185 during the reverse program scheme), the memory cells corresponding to selected word line WLn 1183, and the memory cells corresponding to second adjacent word line WLn+1 (e.g., second word line 1185 during the forward program scheme, or first word line 1181 during a reverse program scheme) are programmed in sequence.

In some implementations, first adjacent word line WLn−1 (e.g., first word line 1181) is closer to source line 114 than second adjacent word line WLn+1 (e.g., second word line 1185) during the forward program scheme. In some implementations, second adjacent word line WLn+1 (e.g., first word line 1181) is closer to source line 114 than first adjacent word line WLn−1 (e.g., second word line 1185) during the reverse program scheme.

In some implementations, word lines 118 may further include a word line WLn−2 (e.g., a third word line 1187 during the forward program scheme, or a fourth word line 1189 during the reverse program scheme) adjacent to first adjacent word line WLn−1, and a word line WLn+2 (e.g., fourth word line 1189 during the forward program scheme, or third word line 1187 during the reverse program scheme) adjacent to second adjacent word line WLn+1. During a forward program scheme or a reverse program scheme, the memory cells corresponding to third word line WLn−2, the memory cells corresponding to first adjacent word line WLn−1, the memory cells corresponding to selected word line WLn 1183, the memory cells corresponding to second adjacent word line WLn+1, and the memory cells corresponding to fourth word line WLn+2 are programmed in sequence.

Referring to verification operation 504 in which a first verification voltage is applied to the selected word line WLn corresponding to the target memory cell. For example, the first verification voltage is similar to a first read voltage. In some implementations, the first pass voltage during the read operation (Vpass_r1) is lower than the first pass voltage during the verification operation (Vpass_v1). In some implementations, the second pass voltage during the read operation (Vpass_r2) is higher than the second pass voltage during the verification operation (Vpass_v2). In some implementations, verification operation 504 may be performed after operation 502.

Referring to operation 506 in which the first read voltage is applied to the selected word line WLn (e.g., selected word line WLn 1183) corresponding to the target memory cell, a first pass voltage is applied to a first unselected word line WLn−1 (e.g., first word line 1181 during the forward program scheme, or second word line 1185 during the reverse program scheme) corresponding to memory cells adjacent to the target memory cell, and a second pass voltage is applied to a second unselected word line WLn+1 (e.g., second word line 1185 during the forward program scheme or first word line 1181 during the reverse program scheme) corresponding to memory cells adjacent to the target memory cell, where the second pass voltage is higher than the first pass voltage.

Figure 6:
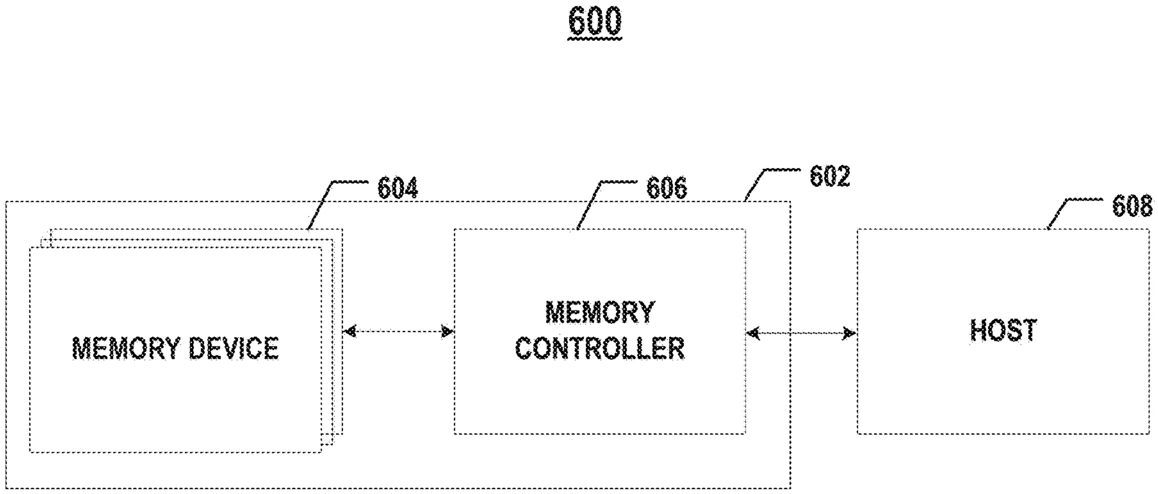
FIG. 6 illustrates a block diagram of an example system having a memory device, according to some implementations of the present disclosure.

FIG. 6 illustrates a block diagram of a system 600 having a memory device, according to some aspects of the present disclosure. System 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, system 600 can include a host 608 and a memory system 602 having one or more memory devices 604 and a memory controller 606. Host 608 can be a processor of an electronic device, such as a central processing unit (CPU), or a system-on-chip (SoC), such as an application processor (AP). Host 608 can be configured to send or receive the data to or from memory device 604.

Memory devices 604 can be any memory devices disclosed herein, such as memory devices 100. In some implementations, each memory device 604 includes a memory device, as described above in detail.

Memory controller 606 is coupled to memory device 604 and host 608 and is configured to control memory device 604, according to some implementations. Memory controller 606 can be any memory controller disclosed herein. Memory controller 606 can manage the data stored in memory device 604 and communicate with host 608. In some implementations, memory controller 606 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed for operating in a high duty-cycle environment SSDs or embedded multi-media-cards (eMMCs) used as data storage for mobile devices, such as smartphones, tablets, laptop computers, etc., and enterprise storage arrays. Memory controller 606 can be configured to control operations of memory device 604, such as read, erase, and program operations. Memory controller 606 can also be configured to manage various functions with respect to the data stored or to be stored in memory device 604 including, but not limited to bad-block management, garbage collection, logical-to-physical address conversion, wear leveling, etc. In some implementations, memory controller 606 is further configured to process error correction codes (ECCs) with respect to the data read from or written to memory device 604. Any other suitable functions may be performed by memory controller 606 as well, for example, formatting memory device 604. Memory controller 606 can communicate with an external device (e.g., host 608) according to a particular communication protocol. For example, memory controller 606 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 7A:
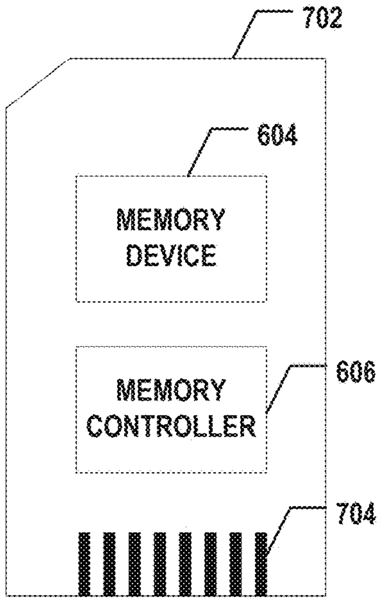
FIG. 7A illustrates a diagram of an example memory card having a memory device, according to some implementations of the present disclosure.
Figure 7B:
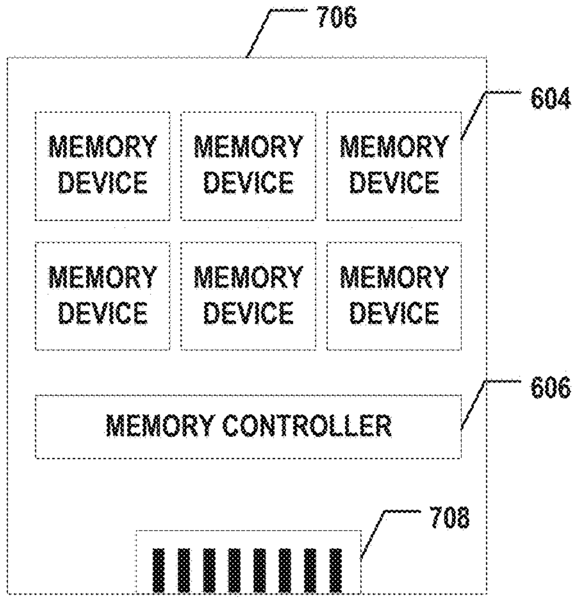
FIG. 7B illustrates a diagram of an example solid-state drive (SSD) having a memory device, according to some implementations of the present disclosure.

Memory controller 606 and one or more memory devices 604 can be integrated into various types of storage devices, for example, be included in the same package, such as a universal Flash storage (UFS) package or an eMMC package. That is, memory system 602 can be implemented and packaged into different types of end electronic products. In one example as shown in FIG. 7A, memory controller 606 and a single memory device 604 may be integrated into a memory card 702. Memory card 702 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 702 can further include a memory card connector 704 coupling memory card 702 with a host (e.g., host 608 in FIG. 6). In another example as shown in FIG. 7B, memory controller 606 and multiple memory devices 604 may be integrated into an SSD 706. SSD 706 can further include an SSD connector 708 coupling SSD 706 with a host (e.g., host 608 in FIG. 6). In some implementations, the storage capacity and/or the operation speed of SSD 706 is greater than those of memory card 702.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method of operating a memory device, comprising:
- applying a first read voltage to a first word line WLn corresponding to target memory cells during a first period;
- applying a first pass voltage to a second word line WLn−1 corresponding to memory cells adjacent to the target memory cells during the first period; and
- applying a second pass voltage to a third word line WLn+1 corresponding to memory cells adjacent to the target memory cells during the first period, wherein the second pass voltage is higher than the first pass voltage.

2. The method of claim 1, wherein in a forward programming scheme or a reverse programming scheme, the second word line WLn−1, the first word line WLn, and the third word line WLn+1 are applied with program voltages in sequence.

3. The method of claim 2, wherein in the forward programming scheme, the second word line WLn−1 is closer to a source select gate of a memory string of the memory device than the third word line WLn+1.

4. The method of claim 2, wherein in the reverse programming scheme, the third word line WLn+1 is closer to a source select gate of a memory string of the memory device than the second word line WLn−1.

5. The method of claim 1, wherein the second pass voltage is between 7V and 9V.

6. The method of claim 1, wherein the first pass voltage is between 6V and 8V.

7. The method of claim 1, further comprising:
- applying a third pass voltage to a fourth word line WLn−2; and
- applying a fourth pass voltage to a fifth word line WLn+2, wherein the third pass voltage is equal to or lower than the first pass voltage.

8. The method of claim 7, wherein the fourth pass voltage is lower than the second pass voltage.

9. The method of claim 7, wherein the fourth pass voltage is higher than the first pass voltage.

10. A memory device, comprising:
- a memory cell array comprising memory cells; and
- a peripheral circuit coupled to the memory cell array, wherein the peripheral circuit is configured to:
  - apply a first read voltage to a first word line WLn corresponding to target memory cells during a first period;
  - apply a first pass voltage to a second word line WLn−1 corresponding to memory cells adjacent to the target memory cells during the first period; and
  - apply a second pass voltage to a third word line WLn+1 corresponding to memory cells adjacent to the target memory cells during the first period, wherein the second pass voltage is higher than the first pass voltage.

11. The memory device of claim 10, wherein in a forward programming scheme or a reverse programming scheme, the second word line WLn−1, the first word line WLn, and the third word line WLn+1 are applied with program voltages in sequence.

12. The memory device of claim 11, wherein in the forward programming scheme, the second word line WLn−1 is closer to a source select gate of a memory string of the memory device than the third word line WLn+1.

13. The memory device of claim 11, wherein in the reverse programming scheme, the third word line WLn+1 is closer to a source select gate of a memory string of the memory device than the second word line WLn−1.

14. The memory device of claim 10, wherein the second pass voltage is between 7V and 9V.

15. The memory device of claim 10, wherein the first pass voltage is between 6V and 8V.

16. The memory device of claim 10, wherein the peripheral circuit is configured to:
- apply a third pass voltage to a fourth word line WLn−2; and
- apply a fourth pass voltage to a fifth word line WLn+2, wherein the third pass voltage is equal to or lower than the first pass voltage.

17. The memory device of claim 16, wherein the fourth pass voltage is lower than the second pass voltage.

18. The memory device of claim 16, wherein the fourth pass voltage is higher than the first pass voltage.

19. A memory system, comprising:
- a memory device; and
- a memory controller coupled to the memory device, wherein the memory device comprises:
  - a memory cell array comprising memory cells; and
  - a peripheral circuit coupled to the memory cell array, wherein the peripheral circuit is configured to:
    - apply a first read voltage to a first word line WLn corresponding to target memory cells during a first period;
    - apply a first pass voltage to a second word line WLn−1 corresponding to memory cells adjacent to the target memory cells during the first period; and
    - apply a second pass voltage to a third word line WLn+1 corresponding to memory cells adjacent to the target memory cells during the first period, wherein the second pass voltage is higher than the first pass voltage.

20. The memory system of claim 19, wherein the peripheral circuit is configured to:
- apply a third pass voltage to a fourth word line WLn−2; and apply a fourth pass voltage to a fifth word line WLn+2, wherein the third pass voltage is equal to or lower than the first pass voltage.

* * * * *